United States Patent

[11] 3,566,236

[72] Inventor William Z. Johnson
2900 Douglas Drive N. Apt. 337,
Minneapolis, Minn. 55422

[21] Appl. No. 768,461
[22] Filed Oct. 17, 1968
[45] Patented Feb. 23, 1971

[54] AMPLIFIER OUTPUT STAGE COUPLING
9 Claims, 4 Drawing Figs.

[52] U.S. Cl. 330/192, 330/118, 330/128
[51] Int. Cl. H05f 3/22
[50] Field of Search 330/119, 120, 122, 123, 192, 196, 128

[56] References Cited

UNITED STATES PATENTS 2,904,644 9/1959 Wilkins 330/128X

*Primary Examiner*—Nathan Kaufman
*Attorney*—Schroeder, Siegfried & Ryan

ABSTRACT: An amplifier output stage coupling utilizing tetrodes in a push-pull circuit configuration with a transformer output in which the cathodes are coupled into the secondary winding of the transformer and the screen grids are energized through signals controlled by the cathode energization and held to a fixed differential with the cathode.

INVENTOR.
WILLIAM Z. JOHNSON
BY
Schroeder, Siegfried & Ryan
ATTORNEYS

INVENTOR.
WILLIAM Z. JOHNSON
BY
Schroeder, Siegfried & Ryan
ATTORNEYS

AMPLIFIER OUTPUT STAGE COUPLING

This invention relates to amplifier output stage couplings, and in particular to an amplifier utilizing a multielement electric conducting device in a push-pull circuit configuration coupled to a transformer to provide the output therefrom.

Amplifiers with transformers as an output coupling element have previously been utilized. Similarly, multielement electric conducting devices, such as tetrodes, have been utilized in push-pull circuit configuration to provide high amplification. Additionally, output stages employing special transformers to utilize multielement coupling have previously been utilized. In such prior circuits, output transformers with special winding configurations have been required but such devices have failed to improve the couplings between the primary and secondary windings of such transformers. In addition, such circuits have excessive driving requirements or have failed to maintain proper bias relationships between the elements of the conducting devices such as to achieve optimum operating parameters for such devices.

The improved amplifier output stage coupling of the present invention is directed to multielement electric conducting devices, such as tetrodes of the vacuum tube or solid state type, which are transformer coupled to an output circuit with the coupling providing a control for the energization of certain elements of the devices to achieve optimum circuit parameters. Specifically, the improved amplifier output stages coupling circuit employs multielement electric conducting devices in a push-pull circuit configuration, coupled to an output transformer and employing a unique coupling method to allow multielement coupling while at the same time preserving classic tetrode operation. The coupling circuit between one of the elements of the device in the circuit and the transformer provide a control signal for an energizing source to another of the elements of the device to maintain a desired bias relationship with the device to achieve optimum operating characteristics of the device in the circuit. This provides improved push-pull coupling of the amplifier with reduced distortion and internal impedance.

It is therefore an object of this invention to provide an improved amplifier output stage coupling.

Another object of this invention is to provide an improved amplifier output stage coupling utilizing conventional transformers.

A further object of this invention is to provide in an amplifier output stage coupling, a circuit having reduced internal impedance and reduced output distortion.

Still another object of the invention is to provide an improved amplifier output stage coupling with partial cathode coupling, while maintaining classic tetrode operating parameters with substantially the same efficiency and drive requirements.

These and other objects of this invention will become apparent from the reading of the attached description together with the circuit drawings.

Figures 1, 2:
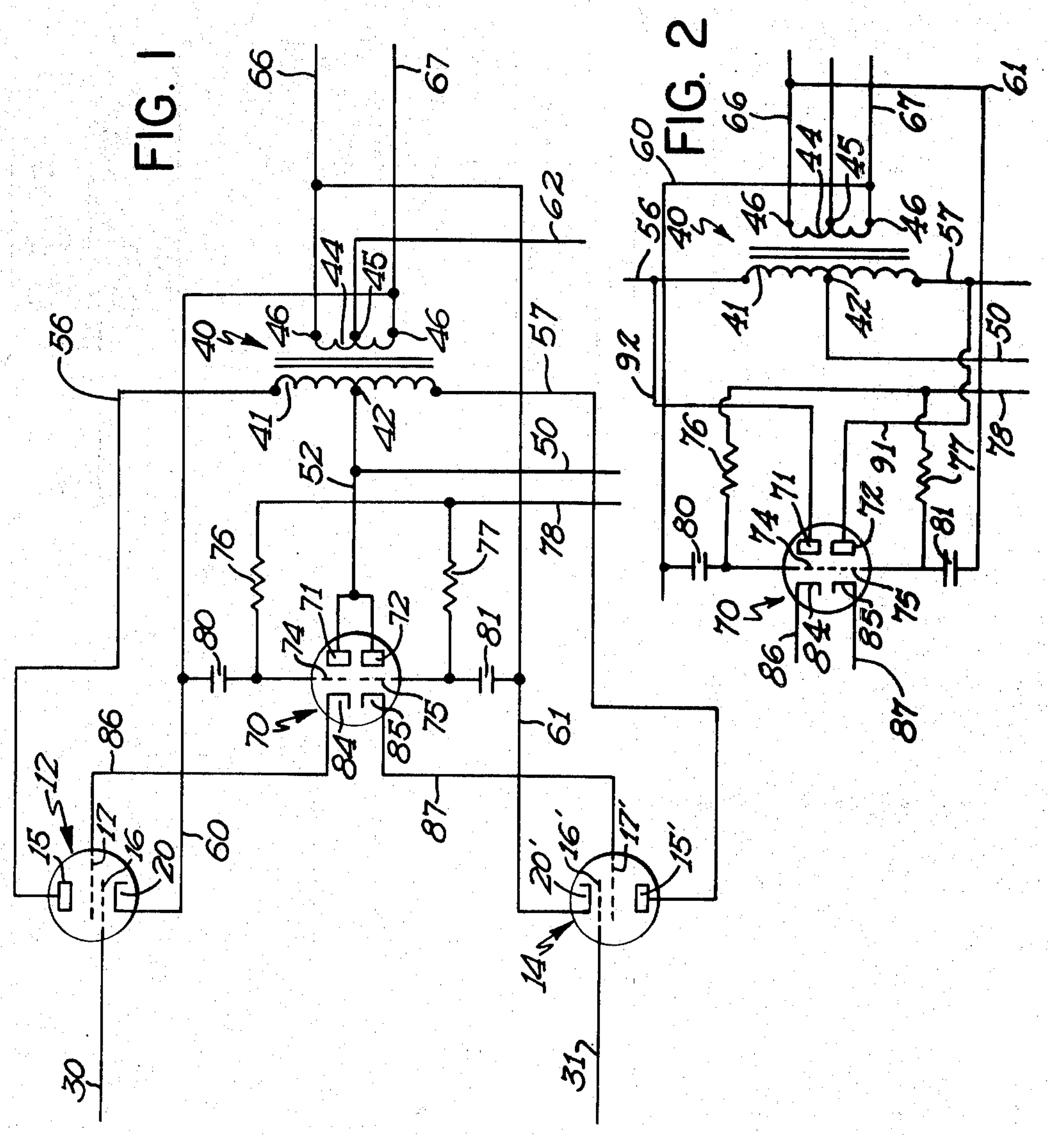
FIG. 1 is a circuit diagram of the improved amplifier output stage coupling.
FIG. 2 is a circuit diagram showing modification of a bias connection of the improved amplifier output stage coupling of FIG. 1.

My improved amplifier output stage coupling is shown in FIG. 1 as incorporating a pair of tetrodes 12 and 13 connected in push-pull circuit configuration. Although I have shown the circuit as incorporating tetrode vacuum tubes, it will be understood that similar multielement electric conducting valves, or equivalent solid state conducting devices, may be utilized for this purpose. The tetrodes incorporate the plate 15, control grid 16, screen grid 17 and cathode 20 elements in a conventional manner. The tetrode 14 incorporates the same elements which are similarly numbered with a prime added thereto for distinguishing purposes. In the amplifying circuit, a double ended input is provided as indicated by conductors 30, 31 which are connected, respectively, to the control electrodes 16 and 16′ of the tetrode. The amplifying circuit includes, as a part of the output stage coupling, an output transformer, indicated at 40, having a primary winding 41 which is center tapped at 42 and a secondary winding 44 having at least a center tap, such as is indicated at 45. The secondary winding may include additional turns and the output may be taken at any desired points in the complete secondary winding, such as at the taps 46, as indicated in FIG. 1.

The energization circuit for the amplifier includes a conductor 50 which would be connected to a DC power supply of sufficient voltage to operate the tetrodes. This conductor is connected to a conductor 52 leading to the center tap 42 of the primary winding with conductors 56, 57, respectively, leading from the extremities of the primary winding to the plate electrodes 15, 15′ of the tetrodes. In the conventional circuitry for tetrodes, the cathodes would normally be connected to a common or ground conductor or a B− voltage supply. In my improved circuit, the cathodes of the output tubes or tetrodes are connected through conductors 60, 61, respectively, to the secondary winding 44 of the output transformer 40 at 16 ohm taps, indicated at 46, with a 4 ohm tap being connected through a conductor 62 to a common or ground so that the signal voltages which are of opposite phase at the cathodes and plates of each device are additive or in-phase in the transformer. Thus, it will be seen in the circuit drawing that the conductors 60, 61 connected to the opposite sides of the secondary winding with respect to the primary winding and the extremities thereof to which the plates of the same tubes are connected. As indicated in the circuit diagram, conductors 66, 67 represent the output of the amplifying circuit which connect to these taps or to the extremities of the secondary winding.

An additional tube, a dual triode indicated at 70, is included as a source of voltage supply for the screen grids 17, 17′ of the tetrodes in the following manner. The dual triodes, through its plates 71, 72, which are connected in common, and to the conductor 52, are energized from the B+ or DC power supply 50. The control electrodes 74, 75 are connected through bias resistors 76, 77 to a common conductor 78 leading to the regulated DC voltage reference source, such as is indicated by the conductor 78. The cathode coupling circuits, as evidenced by the conductors 60, 61 additionally supply the control energization for the grids 74, 75 of the dual triode. Thus, as shown in the drawing, capacitors 80, 81 are connected between conductors 60, 61 and their respective grids 74, 75 to provide an AC coupling source for this voltage from the output cathode coupling circuit to the grids of the dual triode. The cathodes 84, 85 of the dual triode are in turn connected through conductors 86, 87, respectively, to the screen grids 17, 17′ of the tetrodes in a cathode follower type circuit for energization of the screen grids. Thus, the signal voltage on the cathodes of the respective tetrodes 12 and 14 is applied to the grids 74, 75, respectively, of the dual triode whose cathode 84, 85, respectively is connected to the screen grids 17, 17′, respectively, of that same tetrode. In this manner, the signal on the cathodes is referenced to the screen grids to maintain a fixed potential difference between the cathode and screen for proper tetrode operation.

A modification of this circuit is shown in FIG. 2 in which the plates 71, 72 of the dual triode 70 supplying the control voltage to the screen grids 17, 17′ of the tetrodes, are energized from the primary winding 41 of the coupling transformer 40 to linearize the cathode follower action of the dual triode 70. In FIG. 2, the connection of the DC source 50 to the plates 71, 72 is omitted and the plate 71 of the dual triode is connected through a conductor 92 to one extremity of the primary winding 41 common to conductors 56, at which extremity of the primary winding the voltage is in-phase with the voltage at the secondary winding to which the control grid 74 is connected.

Similarly, plate 72 of the dual triode is connected through a conductor 91 to the extremity of the primary winding 41 of the coupling transformer 40, common to conductor 57, whose voltage is in-phase with the voltage at the extremity of the secondary winding 44 connected to control grid 75 of the dual triode. The remaining portions of the circuits are identical with that shown in FIG. 1 and the operation of the circuit is unchanged from that of FIG. 1 as will be hereinafter defined.

The improved amplifier output stage coupling shown in FIGS. 1 and 2 operates similarly to tetrodes in a push-pull circuit configuration coupled to a transformer. Input signals are applied from the double-ended input through the conductors 30, 31 to the control grids of the tetrodes 16, 16', respectively. The power is supplied to the plates through the transformer primary winding in a conventional manner. As one tube cathode goes positive due to the presence of a signal, the same signal is applied, in-phase, to the screen grid of that tube via the action of the appropriate one-half of the dual triode acting as a cathode follower and superimposed upon the regulated DC bias provided by cathode follower action of the dual triode through reference of its grid to a regulated reference voltage through conductor 78 and resistors 76, 77. Thus, the requirement of a fixed potential difference between the screen and cathode is met while signal voltage is applied to both. With this improved circuit, the internal impedance of the tetrodes, as connected in this circuit, approaches that a triode stage. Output stage distortion from the secondary winding of the transformer is significantly reduced and the driving voltage requirements are substantially that of a conventional tetrode. With this improved amplifier output stage coupling, the push-pull coupling of the tetrodes is improved and the complex load driving ability of the circuit is enhanced.

Figure 3:
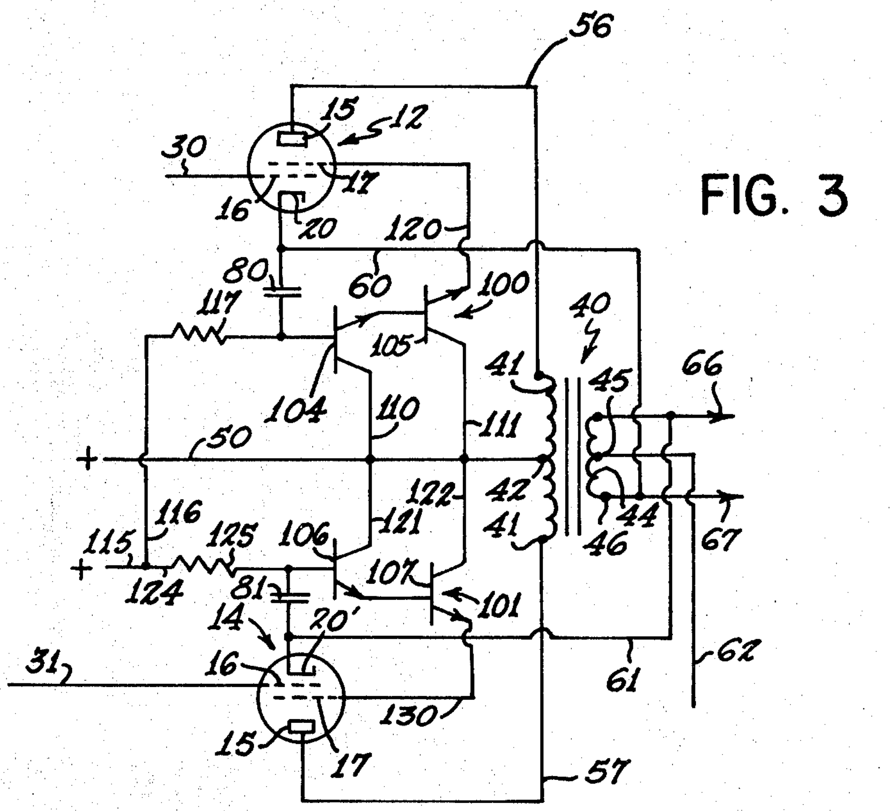
FIG. 3 is a circuit diagram of another embodiment of the improved amplifier output stage coupling.

The embodiment of the improved amplifier output stage coupling shown in FIG. 3 utilizes a pair of direct coupled NPN bipolar transistors in place of one-half of the dual triode shown in FIGS. 1 and 2 as the voltage source for the screen grid of each tetrode. For simplicity, the portions of the circuit which remains unchanged from the preferred embodiment are given the same number as in the preferred embodiment and will be discussed only generally. Thus, the tetrode 12 and 14 have their respective plates 15, 15' connected to the extremities of the primary winding 41 of the coupling transformer 40 with the control grids 16, 16' being connected to the input circuit evidenced by conductors 30, 31. Cathodes 20, 20' of the tetrodes are connected through the respective conductors 60, 61 to opposite sides of the secondary winging 44 of the coupling transformer to be in-phase with the signals applied to the plates 15, 15' as previously indicated. Primary winding 41 of the coupling transformer is connected to the DC power source 50 at its center tap, and the output of the bipolar transistors energize the screen grids 17, 71' of the tetrodes which are connected in a conventional push-pull relationship with the coupling transformer. Thus, as will be seen in FIG. 3, the respective screen grids 17, 17' of the tetrodes indicated generally at 100 and 101, respectively, such that the signals thereon are referenced to the cathodes and are maintained at a fixed potential difference with respect to the cathode for proper tetrode operation. The pair of transistors, indicated generally at 100, include transistors 104 and 105 which are directly coupled together and are of the NPN type. The respective collectors of these transistors are connected through conductors 110, 111, respectively, to the DC power supply 50. The base of the transistor 104 is connected to the cathode conductor 60 through the capacitor 80 and a bias signal from a DC source, indicated by conductor 115, is connected to the cathode conductor 60 through the capacitor 80 and a bias signal from a DC source, indicated by conductor 115, is connected through a conductor 116 and a bias resistor 117 to the base. The emitter electrode of the transistor 104 is directly coupled to the base electrode of the transistor 105, whose emitter is connected through a conductor 120 to the screen grid 17 of tetrode 12. Similarly, the respective collectors of the transistors 106, 107, forming the voltage source 101 for the screen grid 17' of tetrode 14, are connected through conductors 121, 122, respectively, to the DC source conductor 50. The base electrode of the transistor 106 is similarly connected to the conductor 61 common to the cathode 20' of tetrode 14 through the coupling condenser 81, and this base is also energized by a signal from the DC source conductor 115 through a conductor 124 and bias resistor 145 connected to the base. The emitter electrode of the transistor 106 is directly coupled to the base electrode of the transistor 107, and the emitter electrode of the transistor 107 is in turn connected through a conductor 130 to the screen grid 17' of the tetrode 14. While I have shown a pair of transistors forming the controlled voltage source for the screen grid energization, it will be recognized that a single transistor or a plurality of direct coupled transistors may be employed depending upon the operating characteristics of the same. In each instance, the control signal for this voltage source is taken from the respective cathodes and the output is connected or impressed on the screen grids to maintain the fixed voltage differential between the respective screens and cathodes of the tetrodes for proper tetrode operation. The overall operating characteristics of this embodiment of the amplifier output stage coupling remains unchanged from the preferred embodiment with the screen grid energization being controlled from the signal impressed on the respective cathodes such that the screen grid energization will follow along with the cathode at a fixed differential therefrom.

Figure 4:
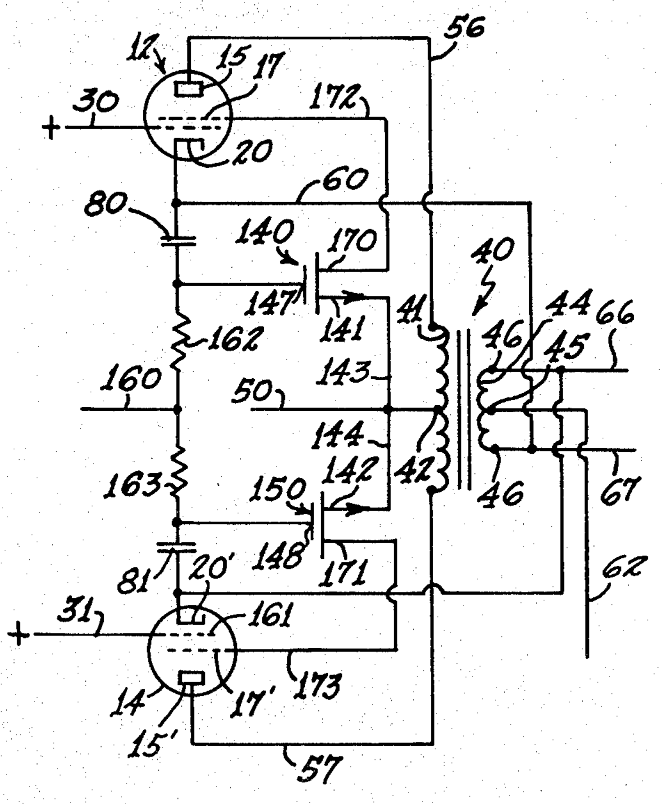
FIG. 4 is a circuit diagram of still another embodiment of the improved amplifier output stage coupling.

The embodiment of the invention shown in FIG. 4 utilized field effect or unipolar transistors in place of the dual triodes as the voltage source for the screen grids of the tetrodes. As in FIG. 3, the portion of the circuit which remains unchanged is numbered as in the preferred embodiment, and a description of the same is omitted for simplicity. In FIG. 4, the field effect or unipolar transistors are numbered 140, 150, respectively, with their respective drain electrodes 141 and 142 being connected through conductors 143, 144 to the DC voltage source 50. The respective gate electrodes 147, 148 of the field effect transistors are connected through the capacitors 80, 81, respectively, to the cathodes 20, 20' of the tetrodes 12 and 14 to receive a control signal therefrom in accord with cathode energization. In addition, the gate electrodes are connected to a bias source of regulated DC voltage, indicated by the connected to a bias conductor 160, which is connected to bias resistors 162, 163, respectively, and to the gate electrodes 147, 148 common to the coupling condensers 80, 81. The transistors 140, 150 include source electrodes 170, 171 which are connected respectively through conductors 172, 173 to the screen grids 17, 17' of the tetrodes. In this embodiment, the field effect transistors form the control voltage source for the screen grids which are referenced to the cathodes 20, 20' of the tetrodes so that the fixed differential voltage will be maintained between cathodes and screen grids of the respective tetrodes for proper tetrode operation. The improved amplifier output stage coupling of this embodiment operates in the same overall manner in that the tetrodes are connected in a push-pull configuration to the coupling transformer with improved transformer coupling and complex load driving ability.

It will be understood that while I have disclosed this amplifier output stage coupling with tetrodes, that similar multielement conducting devices may be employed for this purpose. Therefore, in considering this invention it should be remember that the disclosure herein is illustrative only and the scope of the invention should be determined by the appended claims.

I claim:

1. An amplifier output stage coupling comprising a first pair of multielement electric amplifying devices connected in a push-pull type of amplification circuit, each of said electric conducting devices having at least a pair of control electrodes and a pair of power electrodes, a double ended input circuit connected respectively to one of the control electrodes of each of said conducting devices, an output transformer having a secondary winding with at least a center tap and a center tapped primary winding circuit, circuit means connecting the center tap of the primary winding to a DC source and the extremities of the said primary winding respectively to one of the power electrodes of each of the electric conducting devices, a second pair of multielement electric conducting devices having at least one control element electrode and two power electrodes, circuit means connecting one of the power electrodes of each of the conducting devices of the second pair to a source of power, additional circuit means connecting the secondary winding of the coupling transformer on either side of the center tap to each of the control elements of the second pair of electric conducting devices respectively and to each of the other of the power electrodes of the first pair of electric conducting devices respectively, and a coupling circuit energizing the other of control electrodes of the first conducting devices from the other of the power elements of the second pair of conducting devices respectively.

2. The amplifier output stage coupling of claim 1 in which the circuit means connecting one of the power electrodes of each of the second pair of electric conducting devices connects said power electrodes in common and to a DC source of power.

3. The amplifier output stage coupling of claim 1 in which the circuit means connecting the power electrodes of each of the second pair of electric conducting devices connects said power electrodes respectively to the sides of the primary winding of the coupling transformer where the voltage is in-phase with the voltage at the extremity of the secondary winding which is connected to the control element of said respective electric conducting device of said second pair.

4. The amplifying output stage coupling of claim 1 in which said circuit means connecting the secondary winding of the coupling transformer to said another of the power electrodes of the first pair of conducting devices includes an AC coupling to the control electrodes of the second pair of multielement circuit conducting devices.

5. The amplifier output stage coupling of claim 4 in which the first pair of multielement electric conducting devices are tetrodes having cathode, control, screen and plate electrodes, respectively, and in which the plate electrodes are connected to the extremities to the primary winding of the coupling transformer and the cathode electrodes are connected in a coupling circuit to the secondary winding of the coupling transformer with the screen electrodes being connected to the other of the power elements of the second pair of conducting devices.

6. The amplifier output stage coupling of claim 5 in which the second pair of multielement electric conducting devices are triode connected in a cathode follower type circuit with the cathodes of the triodes energizing the screen electrodes of the tetrodes forming the first pair of electric conducting devices.

7. The amplifier output stage coupling of claim 5 in which the second pair of multielement electric conducting devices are NPN type transistors with the base electrodes of each pair being energized from the cathodes of the tetrodes and with an emitter of each pair being connected to the screen electrodes of the tetrodes forming the first pair of electric conducting devices.

8. The amplifier output stage coupling of claim 5 in which the second pair of multielement electric conducting devices are field effect transistors in which the gate electrodes of the respective second pair of electric conducting devices are connected to and energized from the cathodes of the tetrodes and in which the source electrodes of the field effect transistors are connected to the screen electrodes of the tetrodes forming the first pair of electric conducting devices to energize the screen electrodes at a voltage level which remains fixed with respect to the cathodes as the cathode voltage varies about a fixed difference.

9. The amplifier output stage coupling of claim 5 in which the second pair of multielement electric conducting devices are each at least two semiconducting devices directly coupled with the base electrodes of one transistor being connected to and energized from the cathodes of the tetrodes forming the first pair of multielement electric conducting devices and in which an emitter electrode of another of the transistors is connected to the screen electrode of the tetrode to energize the screen electrode at a voltage level which is maintained at a fixed differential with the energization of the cathode.

UNITED STATES PATENT OFFICE
CERTIFICATE OF CORRECTION

Patent No. 3,566,236 Dated February 23, 1971

Inventor(s) William Z. Johnson

It is certified that error appears in the above-identified patent and that said Letters Patent are hereby corrected as shown below:

Page 5, Line 37, before "conducting", delete "circuit" and insert -- electric --.

Page 6, Line 9, before "connected", delete "triode" and insert -- triodes --.

Page 6, Line 34, after "base", delete "electrodes" and insert -- electrode --.

Signed and sealed this 21st day of March 1972.

(SEAL)
Attest:

EDWARD M.FLETCHER,JR.
Attesting Officer

ROBERT GOTTSCHALK
Commissioner of Patents